(12) United States Patent
Okamoto et al.

(10) Patent No.: US 6,920,686 B2
(45) Date of Patent: Jul. 26, 2005

(54) COMPONENT MOUNTING APPARATUS

(75) Inventors: Kenji Okamoto, Hirataka (JP);
Kazuyuki Nakano, Yamanashi (JP);
Takeshi Takeda, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 619 days.

(21) Appl. No.: 09/812,249

(22) Filed: Mar. 19, 2001

(65) Prior Publication Data

US 2002/0020056 A1 Feb. 21, 2002

(30) Foreign Application Priority Data

Mar. 17, 2000 (JP) ........................................ 2000-075607

(51) Int. Cl.[7] .............................................. H05K 3/30
(52) U.S. Cl. .............................. 29/740; 29/741; 29/739; 29/721; 29/DIG. 44
(58) Field of Search ........................... 29/740, 741, 743, 29/739, 760, 832, 834, 708, 709, 712, 759, DIG. 44; 294/2, 64.1; 700/160

(56) References Cited

U.S. PATENT DOCUMENTS

| 5,060,366 A | * | 10/1991 | Asai et al. ..................... 29/739 |
| 5,579,572 A | * | 12/1996 | Kashiwagi et al. ........... 29/836 |
| 6,094,808 A | * | 8/2000 | Mimura et al. ................ 29/743 |
| 6,343,415 B1 | * | 2/2002 | Okuda et al. .................. 29/740 |
| 2002/0020056 A1 | * | 2/2002 | Okamoto et al. ............. 29/740 |

* cited by examiner

*Primary Examiner*—Minh Trinh
(74) *Attorney, Agent, or Firm*—Jordan and Hamburg LLP

(57) ABSTRACT

A component mounting apparatus has an intermittently rotated rotary mounting section which has a driver at an upper part for driving motors of mounting heads arranged on periphery of the rotary mounting section. A controller in a stationary part of the apparatus inputs power and control signals to the rotating driver which is formed in an annular shape, and includes motor driver mounting plates with motor drivers for controlling power supplied to each motor. The motor driver mounting plates are arranged radially around a rotation axis of the rotating driver with planar surfaces in parallel to the rotation axis.

9 Claims, 7 Drawing Sheets

COMPONENT MOUNTING APPARATUS

BACKGROUND OF THE INVENTION

1. Technical Field of the Invention

The present invention relates to a component mounting apparatus for mounting parts such as electronic components onto a substrate or the like. More particularly, the invention relates to a component mounting apparatus having a rotary mounting section provided with a plurality of mounting heads on the outer periphery thereof.

2. Description of Related Art

A known high-speed component mounting apparatus includes a rotary mounting section 1 for picking up components from a given component supply source 3 in a supply section 2 and for placing the components on a substrate 5 positioned on an X–Y table 4, as shown in FIG. 6. The apparatus further has a transfer rail for carrying in and out the substrate 5, and a display unit for indicating operating conditions and alarms, should the apparatus malfunctions.

The rotary mounting section 1 includes, as shown in FIG. 7, a rotary table 8 having a plurality of mounting heads 10 on its outer periphery, only one of which is shown in the drawing for ease of illustration, and a rotary drive member 9 having a rotary shaft 8a at its lower face for imparting intermittent motion of the rotary table 8 at a pitch space corresponding to the distance between two adjacent mounting heads 10. Each of the mounting heads 10 includes a suction nozzle 10a for holding a component and a motor 11 used for switching the suction nozzle from one type to another.

The rotary drive member 9 is provided with a support plate 9a thereon which rotates integrally with the rotary shaft 8a. At the peripheral edge of the support plate 9a is provided a plurality of box-shaped drivers 51 for respectively driving each of the motors 11. A mercury contact type connector 52 is provided in the center of the support plate 9a for inputting drive power and control signals for the motors 11 to the drivers 51 from a controller (not shown) built in a stationary part of the apparatus. The drivers 51 output the drive power and control signals thus inputted thereto via the connector 52 to the motors 11 of their respective mounting heads 10 through a wiring 12 passing through the hollow interior of the rotary shaft 8a and the rotary table 8.

Since the circular support plate 9a holds the plurality of evenly spaced box-shaped drivers 51 thereon at its circumference, the space required for allowing the support plate with drivers to freely rotate is reduced as compared to a case where a single such box-shaped driver is held on the support plate. Nevertheless, these drivers 51 still require a relatively large installation space because of their corners protruding beyond the circumference of the support plate, thereby increasing the radius of rotation of the support plate. This causes bulkiness of the apparatus.

The driver 51 accommodates various circuit boards or substrates therein, among which the one having a motor driver for controlling electric current applied to the motor 11 is subjected to a large load and apt to generate heat. It is therefore desirable to cool the substrate, but it is built in a confined space in close proximity to other substrates within a box and effective cooling thereof is hardly achieved. Such substrate is also apt to fail because of the heat, but replacement of the substrate requires considerable work and time in view of the built-in structure, causing the productivity to lower.

SUMMARY OF THE INVENTION

The present invention has been devised in light of the above-described problems encountered by the prior art, and it is an object of the invention to provide a component mounting apparatus with a reduced driver installation space wherein a motor driver, which is apt to generate heat and fail because of large load, to be efficiently cooled and readily replaced.

To achieve the object, a component mounting apparatus according to the present invention includes a rotary table, having a plurality of mounting heads disposed on the periphery thereof and driven to rotate intermittently at a pitch corresponding to a pitch distance between adjacent mounting heads, a driver for driving motors respectively provided in each of the plurality of mounting heads, and a controller placed in a stationary part of the apparatus for inputting power and control signals to the driver. The characteristic feature of the component mounting apparatus is that the driver is formed in an annular shape.

These and other objects and characteristics of the present invention will become further clear from the following description with reference to the accompanying drawings.

DETAILED DESCRIPTION OF THE PREFERRED EMBODIMENTS

Figure 1:
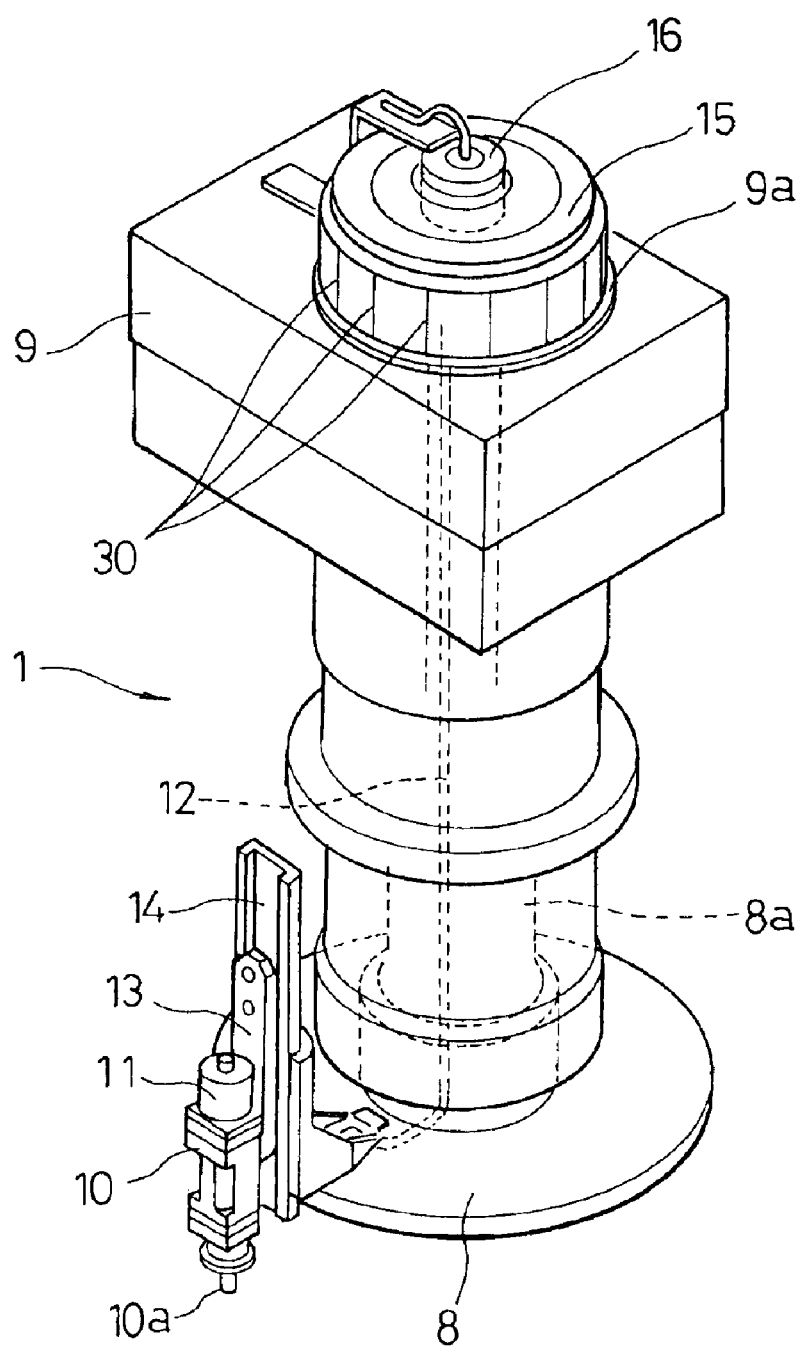
FIG. 1 is a perspective view schematically showing the structure of a rotary mounting section in a component mounting apparatus according to one embodiment of the present invention.

FIG. 1 shows a rotary mounting section 1 of a component mounting apparatus according to one embodiment of the invention. The mounting head 10 is held on a rotary table 8, with its body 13 being slidable upwards and downwards along a slide guide 14. A groove cam (not shown) is provided to a stationary part around the rotary table 8 above the body 13 of the mounting head 10, so that the mounting head 10 is moved upwards and downwards by the engagement between the groove cam and a cam follower (not shown) provided to the body 13 of the nozzle for picking up and mounting of components with the rotation of the rotary table 8. The rotary table 8 holds a plurality of such mounting heads 10 equally spaced at the circumference thereof, only one of which is shown in the drawing for ease of illustration. Each of the mounting heads 10 is rotatable around its axis by their respective motor 11.

A rotary drive member 9 is arranged in an upper part of the rotary mounting section 1, having a support plate 9a, on which an annular driver 15 is mounted for driving and controlling the motor 11 of each mounting head 10. The annular driver 15 rotates in synchronism with the mounting heads 10. A connector 16 is mounted in the hollow part of the annular driver 15, to which drive power and control signals for the motors 11 are input from a controller 17 (see FIG. 2) mounted on a stationary part of the apparatus. The connector 16 is composed of a cylindrical slip ring (not shown) for supplying drive power and an infrared receiver/transmitter 18 for passing on the control signals (see FIG. 2).

Figure 2:
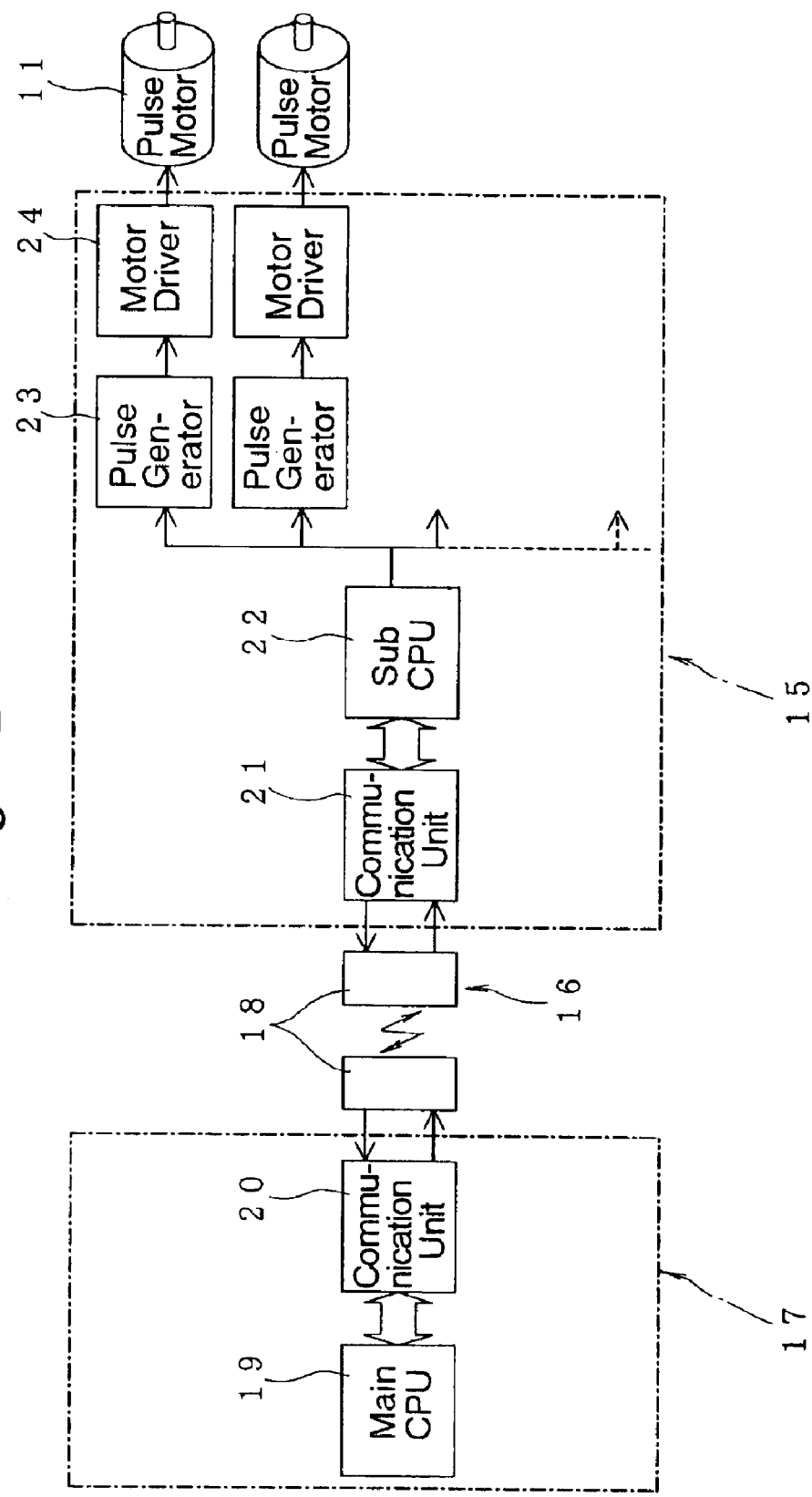
FIG. 2 is a block diagram showing the structure of a controller and a driver in this embodiment.

Referring to FIG. 2, the controller 17 includes a main CPU 19 for controlling the overall operation of the component mounting apparatus, and a communication unit 20 for sending out and receiving control signals to and from the driver 15 via the infrared receiver/transmitter 18. The driver 15 includes a communication unit 21 for sending and receiving the control signals, a sub CPU 22 for processing the control signals, and a pulse generator 23 for outputting electric current control signals for each of the motors 11, which, in this preferred embodiment, are pulse motors, and a motor driver 24 for controlling drive power to the motors based on the electric current control signals and for applying controlled electric current to the motors 11 via a wiring 12.

Figure 3:
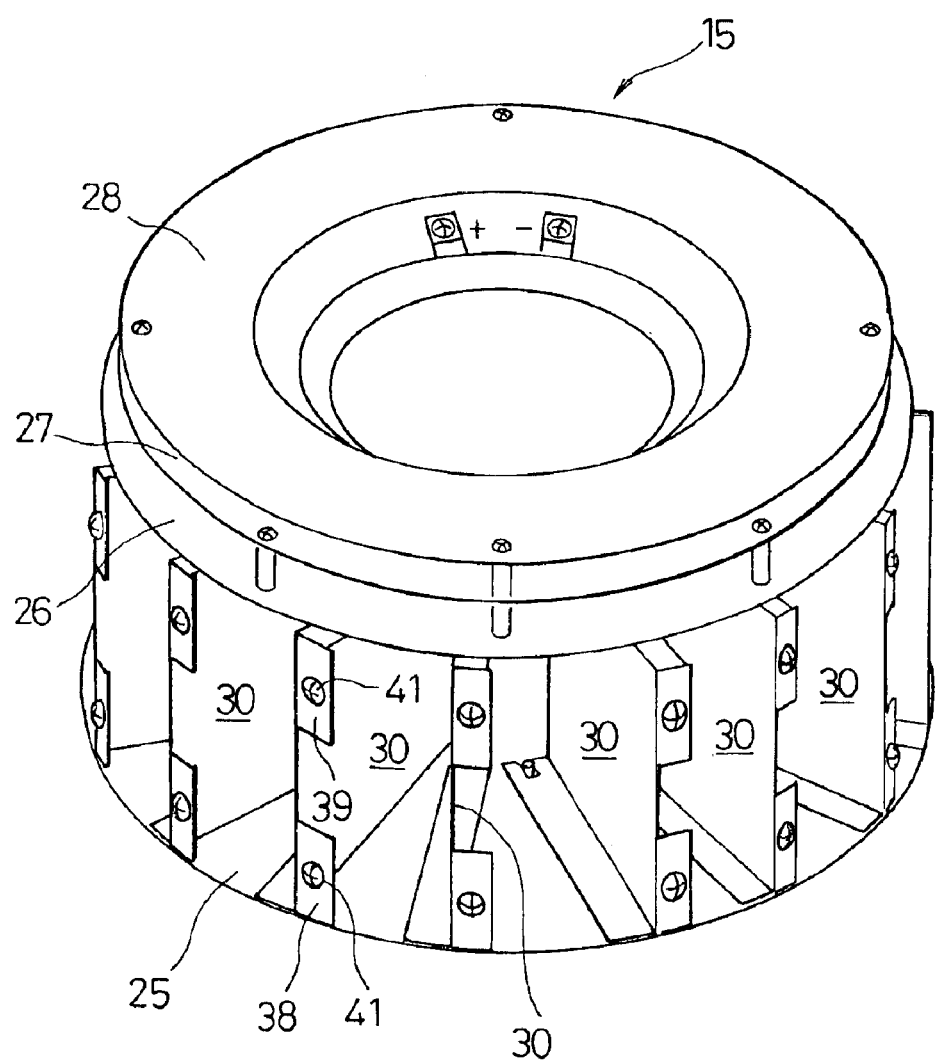
FIG. 3 is a perspective view showing the external appearance of the driver in this embodiment.
Figure 4:
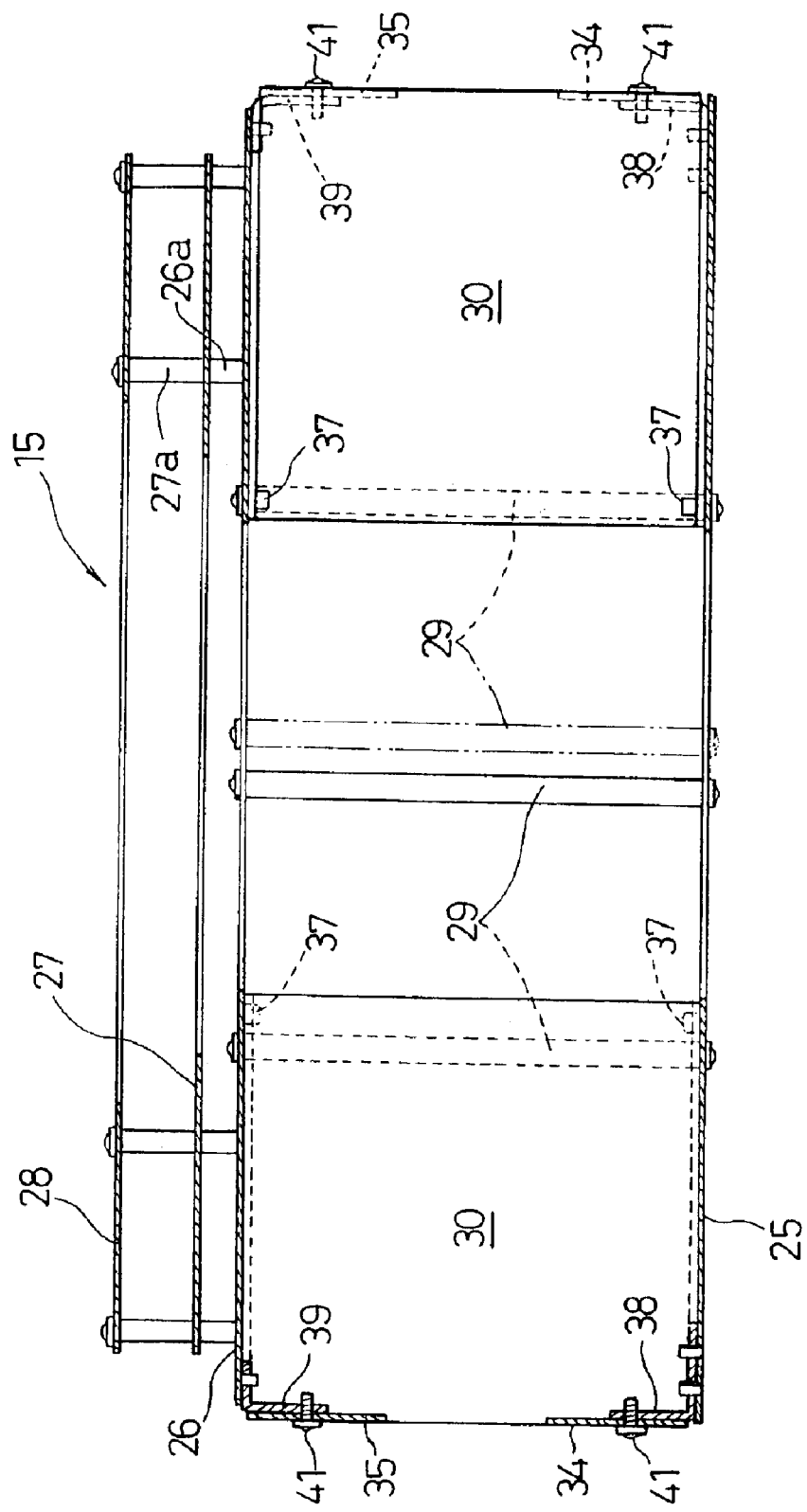
FIG. 4 is a longitudinal cross-sectional view of the driver.
Figure 5:
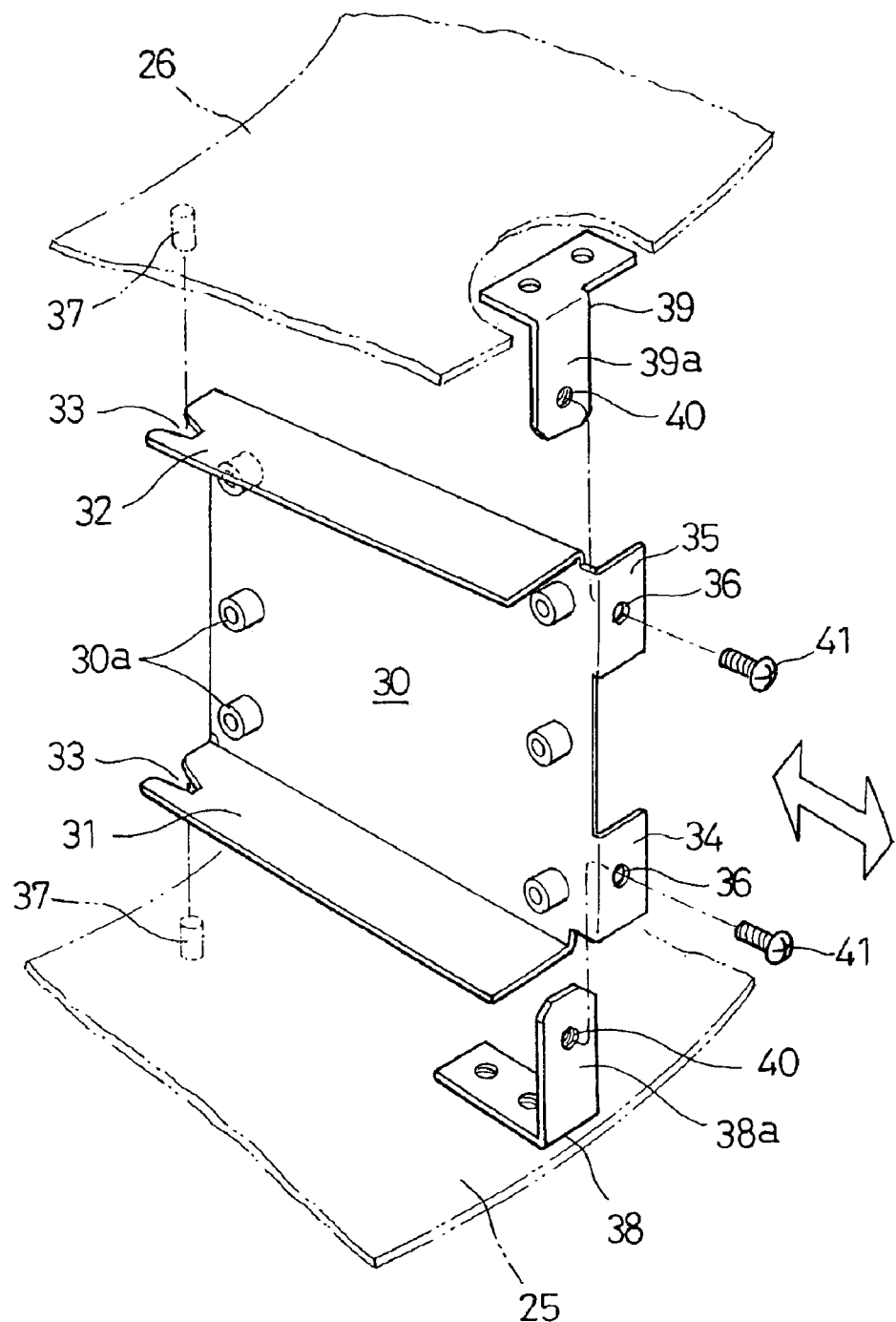
FIG. 5 is a detailed, exploded perspective view showing primary parts of the driver.
Figure 6:
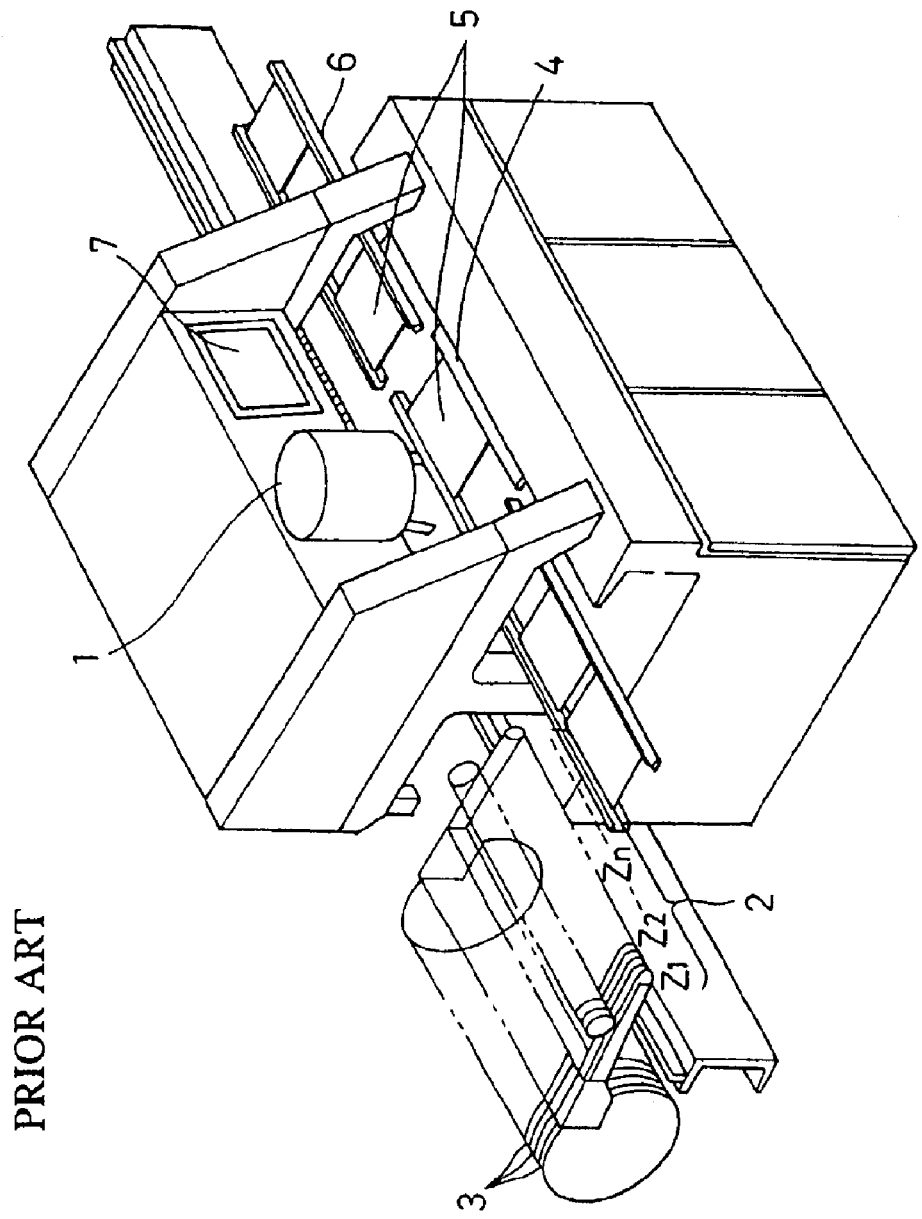
FIG. 6 is a perspective view showing the overall construction of a component mounting apparatus.
Figure 7:
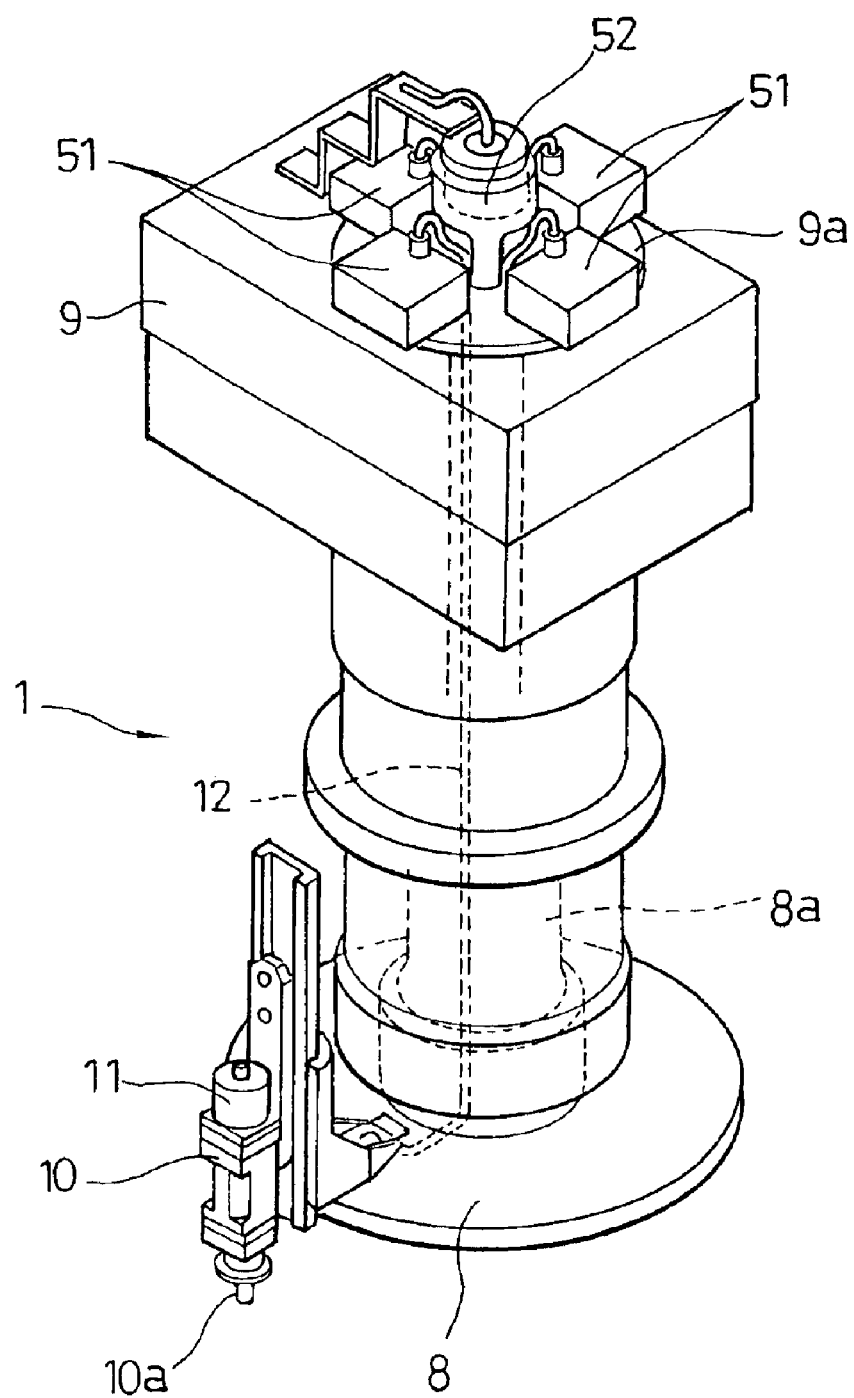
FIG. 7 is a perspective view schematically showing the structure of a conventional rotary mounting section.

The driver 15 includes a lower plate 25, an upper plate 26, a base plate 27, and a cover plate 28, which are all formed in an annular shape, as shown in FIG. 3 to FIG. 5. The lower plate 25 and the upper plate 26 are spaced apart and connected to each other by four posts 29 standing at the inner circumference thereof. The base plate 27 is placed upon protrusions 26a on the upper plate 26 and screwed thereto, while the cover plate 28 is placed upon the protrusions 27a on the base plate 27 and screwed thereto.

On the base plate 27 is arranged the above-mentioned communication unit 21, the sub CPU 22, and the pulse generator 23. Between the lower plate 25 and the upper plate 26 are a plurality of motor driver mounting plates 30 arranged radially around the rotation axis of the driver 15, with their plane surfaces being perpendicular to the lower plate 25, i.e., in parallel to the rotation axis of the rotary table 8. The above-mentioned motor drivers 24 for each of the motors 11 are attached respectively to each one of the motor driver mounting plates 30.

On one side face of the motor driver mounting plate 30 is formed a plurality of mounting bosses 30a as shown in FIG. 5 for attaching a PCB substrate including the motor driver 24. The top edge and the bottom edge of the motor driver mounting plate 30 are bent toward one side for forming bonding flanges 31, 32 which respectively make surface contact with the upper surface of the lower plate 25 and the lower surface of the upper plate 26. The bonding flanges 31, 32 have respective V-shaped notches 33 at the edge on the inner side in the radial direction of the annular upper and lower plates 25, 26. The motor driver mounting plate 30 further includes a lower mounting piece 34 and an upper mounting piece 35 bent toward the other side at the edge on the outer side in the radial direction of the annular upper and lower plates 25, 26. The upper and lower mounting pieces 34, 35 respectively have a mounting hole 36 therein.

The lower plate 25 has a locator pin 37 on its upper surface at the inner periphery thereof, while the upper plate 26 has likewise a locator pin 37 on its lower surface at the inner periphery thereof. These locator pins 37 engage with the notches 33 in the bonding flanges 31, 32, whereby positioning of the motor driver mounting plate 30 in the circumferential direction is achieved. The lower plate 25 further has a lower bracket 38 provided to the upper surface at the outer peripheral edge thereof, while the upper plate 26 has an upper bracket 39 attached to the lower surface at the outer peripheral edge thereof. These brackets 38, 39 respectively have connecting surfaces 38a, 39a which are superposed upon the backside of the mounting pieces 34, 35, respectively, and screw holes 40 formed therein. The mounting pieces 34, 35 are brought into surface contact with the connecting surfaces 38a, 39a with their respective holes 36, 40 in registry, and fastened to each other with bolts 41.

As described above, the driver 15 has a circular shape in cross section, thus reducing the radius of rotation as compared to the prior art. As a result, the driver 15 requires smaller installation space, enabling the apparatus to be made compact.

Thus the plurality of motor driver mounting plates 30, to which are attached PCB substrates including the motor drivers 24 for controlling power supply to the motors 11, stand in parallel to the rotation axis of the driver 15, i.e., perpendicularly to the annular upper and lower plates 25, 26 in a radially distanced arrangement. Accordingly, the motor drivers 24 which apt to generate heat are effectively cooled by air, as a cooling medium, flowing through the space between adjacent motor driver mounting plates 30.

The motor drivers 24 are apt to fail because of heat as mentioned above. Even in the event of failure in some of the motor drivers 24, the invention enables such malfunctioning motor drivers to be readily replaced in view of the motor driver mounting plates 30 that are detachable in a radial direction. Each of the motor driver mounting plates 30 is fixed in position, with its notch 33 at the inner peripheral side edge being engaged with the locator pins 37 of the upper and lower plates 25, 26, and its mounting pieces 34, 35 at the outer peripheral side edge being fastened to the brackets 38, 39 of the upper and lower plates 25, 26 with the bolts 41. Therefore, it is removable in a radial direction as indicated by a white arrow in FIG. 5, and thus mounting and dismounting of the motor driver mounting plate 30 are readily achieved by fastening the bolts 41 or removing same. Even though the driver 15 is disposed in a position relatively high above the rotary mounting section 1, the motor driver mounting plates 30 are readily replaceable due to such structure.

Moreover, the driver 15 of the present invention allows for easy modification in respect of the number of mounting heads 11 to be mounted, i.e., by varying the position and the number of the upper and lower brackets 38, 39 of the upper and lower plates 25, 26, respectively, the number of motor driver mounting plates 30 can be changed as required.

In the preferred embodiment, the controller 17 stops the operation of the component mounting apparatus upon detecting a malfunction in any of the motor drivers 24, and makes an indication on a display 7 or the like for reporting such failure. Furthermore, the controller 17 drives the intermittent rotary driver member 9 so as to cause the motor driver mounting plate 30 to which the malfunctioning motor driver 24 is attached to come to a predetermined position where maintenance is performed. In this way, replacement of a motor driver mounting plate 30 is swiftly effected at a predetermined position in the event of a malfunction of a motor driver, thus improving working efficiency.

The subject matter of the invention is not limited to the above-described specific example and various modifications may be made. For example, the motor 11 may be servo-motors such as AC motors or voice coil motors instead of pulse motors. Also, any suitable structure may be adopted for the connector 16 which, in the above-described embodiment is constructed of a slip ring and an infrared receiver/transmitter.

The motor driver mounting plates 30 should not necessarily be arranged radially as in the above-described embodiment. For example, a suitable number of motor driver members may be arranged perpendicularly in parallel to each other with spaces therebetween, and these groups of motor driver mounting plates may be arranged radially along the circumference of the driver 15. Alternatively, a plurality of motor driver members may be stacked parallel to each other with spaces therebetween in a vertical direction, these groups of motor driver members being radially arranged along the circumference of the driver 15.

As described above, according to the component mounting apparatus of the invention, the rotary driver requires smaller space for installation, enabling the apparatus to be made compact. Motor driver mounting plates, to which motor drivers for controlling motors are attached, are spaced apart from each other, thus achieving high cooling performance and allowing easy access for maintenance.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A component mounting apparatus comprising:
   a rotary table driven to rotate intermittently;
   a plurality of mounting heads disposed on a peripheral surface of the rotary table;
   a plurality of motors respectively provided in each of the plurality of mounting heads;
   an annular driver having an axis of rotation coaxial with the rotary table including a plurality of motor drivers respectively connected to each of the plurality of motors; and
   a controller placed in a stationary part of the apparatus for inputting drive power and control signals to the annular driver,
   wherein the annular driver includes a plurality of motor driver mounting plates for attaching the motor drivers, arranged in parallel to the axis of rotation of the annular driver and spaced apart from each other.

2. The component mounting apparatus according to claim 1, further comprising a display connected to the controller, wherein the controller stops operation of the component mounting apparatus upon detecting a malfunction in any one of the plurality of motor drivers, reports the malfunction through the display, and drives the rotary table to cause the malfunctioning motor driver to a predetermined maintenance position.

3. A component mounting apparatus comprising:
   a rotary table driven to rotate intermittently;
   a plurality of mounting heads disposed on a peripheral surface of the rotary table;
   a plurality of motors respectively provided in each of the plurality of mounting heads;
   an annular driver having an axis of rotation coaxial with the rotary table including a plurality of motor drivers respectively connected to each of the plurality of motors; and
   a controller placed in a stationary part of the apparatus for inputting drive power and control signals to the annular driver,
   wherein the annular driver includes a plurality of motor driver mounting plates for attaching the motor drivers, arranged in parallel to the axis of rotation of the annular driver.

4. The component mounting apparatus according to claim 3, wherein each of the plurality of motor driver mounting plates includes a notch at an inner peripheral side edge thereof and a fastening member at an outer peripheral side edge thereof.

5. The component mounting apparatus according to claim 3, wherein the plurality of motor driver mounting plates for attaching the motor drivers are arranged in parallel to the axis of rotation of the annular driver and spaced apart from each other.

6. The component mounting apparatus according to claim 3, further comprising a display connected to the controller, wherein the controller stops operation of the component mounting apparatus upon detecting a malfunction in any one of the plurality of motor drivers, reports the malfunction through the display, and drives the rotary table to cause the malfunctioning motor driver to a predetermined maintenance position.

7. The component mounting apparatus according to claim 6, wherein the plurality of motor driver mounting plates for attaching the motor drivers are arranged in parallel to the axis of rotation of the annular driver and spaced apart from each other.

8. A component mounting apparatus comprising:
   a rotary table driven to rotate;
   at least one mounting heads disposed on a peripheral surface of the rotary table;
   at least one motors respectively provided in said at least one mounting head;
   an annular driver, having an axis of rotation coaxial with the rotary table, including a plurality of motor driver respectively connected to said at least one motor; and
   a controller for inputting drive power and control signals to the annular driver;
   wherein the annular driver includes at least one motor driver mounting plate for attaching the at least one motor drivers, said at least one motor driver mounting plate being arranged in parallel to the axis of rotation of the annular driver, and the at least one motor driver mounting plate includes at least one notch at an inner peripheral side edge thereof for receiving a locator pin engaged with a plate of said annular driver, and a fastening member at one outer peripheral side edge of the at least one motor driver mounting plate for mounting the at least one motor driver mounting plate.

9. The component mounting apparatus according to claim 8, further comprising a display connected to the controller, wherein the controller stops operation of the component mounting apparatus upon detecting a malfunction in any one of said at least one motor driver, reports the malfunction through the display, and drives the rotary table to move the malfunctioning motor driver to a predetermined maintenance position.

* * * * *